(12) United States Patent
Welker et al.

(10) Patent No.: US 12,177,970 B2
(45) Date of Patent: Dec. 24, 2024

(54) SUPPORT SUBSTRATE AND METHOD FOR PRODUCING A SUPPORT SUBSTRATE

(71) Applicant: Rogers Germany GmbH, Eschenbach (DE)

(72) Inventors: Tilo Welker, Neuhaus (DE); Karsten Schmidt, Eschenbach (DE); Stefan Britting, Schnaittach (DE)

(73) Assignee: ROGERS GERMANY GMBH, Eschenbach (DE)

( * ) Notice: Subject to any disclaimer, the term of this patent is extended or adjusted under 35 U.S.C. 154(b) by 176 days.

(21) Appl. No.: 17/921,024

(22) PCT Filed: Apr. 28, 2021

(86) PCT No.: PCT/EP2021/061054
§ 371 (c)(1),
(2) Date: Oct. 24, 2022

(87) PCT Pub. No.: WO2021/219685
PCT Pub. Date: Nov. 4, 2021

(65) Prior Publication Data
US 2023/0171887 A1 Jun. 1, 2023

(30) Foreign Application Priority Data
Apr. 29, 2020 (DE) ...................... 10 2020 111 700.0

(51) Int. Cl.
*H05K 1/00* (2006.01)
*C04B 37/02* (2006.01)
(Continued)

(52) U.S. Cl.
CPC ......... *H05K 1/0306* (2013.01); *C04B 37/021* (2013.01); *C04B 37/026* (2013.01);
(Continued)

(58) Field of Classification Search
CPC ................. H05K 1/0306; H05K 3/388; H05K 2201/035; C04B 37/021; C04B 37/026; C04B 2237/407
See application file for complete search history.

(56) References Cited

U.S. PATENT DOCUMENTS

| | | | |
|---|---|---|---|
| 3,217,209 A | 11/1965 | Kinsella et al. | |
| 11,177,186 B2 | 11/2021 | Terasaki | |
| 11,277,908 B2 | 3/2022 | Yuasa et al. | |
| 2002/0115303 A1* | 8/2002 | Ohta | H01L 31/105 257/E21.387 |

(Continued)

FOREIGN PATENT DOCUMENTS

| | | |
|---|---|---|
| DE | 19927046 B4 | 1/2007 |
| DE | 102009033029 A1 | 1/2011 |

(Continued)

OTHER PUBLICATIONS

International Search Report for PCT/EP2021/061054, International Filing Date Apr. 28, 2021, Date of Mailing Aug. 16, 2021, 13 pages.
(Continued)

*Primary Examiner* — Pete T Lee
(74) *Attorney, Agent, or Firm* — CANTOR COLBURN LLP

(57) ABSTRACT

A support substrate (1), in particular a metal-ceramic substrate, as a support for electric components, comprising: —at least one metal layer (10) and—an insulating element (30), in particular a ceramic element, a glass element, a glass ceramic element, and/or a high temperature-resistant plastic element. The at least one metal layer (10) and the insulating element (30) extend along a main extension plane (HSE) and are arranged one over the other in a stacking direction (S) running perpendicularly to the main extension plane (HSE), wherein in a completed support substrate (1), a binding layer (12) is formed between the at least one metal layer (10) and
(Continued)

the insulating element (30), and an adhesive layer (13) of the binding layer (12) has a surface resistance which is greater than 5 Ohm/sq.

20 Claims, 9 Drawing Sheets

(51) Int. Cl.
    *H05K 1/03*     (2006.01)
    *H05K 3/38*     (2006.01)
(52) U.S. Cl.
    CPC ........ *H05K 3/388* (2013.01); *C04B 2237/407* (2013.01); *H05K 2201/0355* (2013.01)

(56) References Cited

U.S. PATENT DOCUMENTS

| | | | | |
|---|---|---|---|---|
| 2008/0315351 | A1* | 12/2008 | Kakehata | ............ H01L 27/1266 257/E21.211 |
| 2013/0037922 | A1* | 2/2013 | Arriagada | ........... H01L 23/5226 438/455 |

FOREIGN PATENT DOCUMENTS

| | | |
|---|---|---|
| DE | 102013104739 A1 | 9/2014 |
| DE | 102015108668 A1 | 12/2016 |
| DE | 102013113734 B4 | 3/2018 |
| EP | 0153618 A2 | 9/1985 |
| EP | 3041042 A1 | 7/2016 |
| JP | S6132752 A | 2/1986 |
| JP | H09181423 A | 7/1997 |
| JP | 4325470 B2 | 9/2009 |
| JP | 2013027918 A | 2/2013 |
| JP | 2019081690 A | 5/2019 |
| KR | 20200013677 A | 2/2020 |
| WO | 9116805 A1 | 10/1991 |
| WO | 2011034075 A1 | 3/2011 |

OTHER PUBLICATIONS

International Preliminary Report on Patentability for International Application No. PCT/EP2021/061054, International Filing Date Apr. 28, 2021, Date of Mailing Nov. 3, 2022, 8 pages.

* cited by examiner

SUPPORT SUBSTRATE AND METHOD FOR PRODUCING A SUPPORT SUBSTRATE

CROSS-REFERENCE TO RELATED APPLICATIONS

This application is a National Stage filing of PCT/EP2021/061054, filed Apr. 28, 2021, which claims priority to DE 10 2020 111 700.0, filed Apr. 29, 2020, both of which are incorporated by reference in their entirety herein.

BACKGROUND

The present invention relates to a carrier substrate and a method of manufacturing a carrier substrate.

Carrier substrates, such as metal-ceramic substrates, are sufficiently known as printed circuit boards or circuit boards from the prior art, for example from DE 10 2013 104 739 A1, DE 19 927 046 B4 and DE 10 2009 033 029 A1. Typically, connection areas for electrical components and conductor tracks are arranged on one component side of the metal-ceramic substrate or the carrier substrate, wherein the electrical components and the conductor tracks can be interconnected to form electrical circuits. Essential components of the metal-ceramic substrates are an insulating layer, which is preferably made of a ceramic, and at least one metal layer bonded to the insulating layer. Owing to their relatively high insulating strengths, insulating layers made of ceramics have shown to be particularly advantageous in power electronics. By structuring the metal layer, conductive tracks and/or connection areas for the electrical components may be realized.

A requirement for successfully providing a metal-ceramic substrate is a permanent bond between the metal layer and the ceramic layer. In addition to a so-called direct metal bonding process, i.e., a DCB or DAB process, it is known from prior art to bond the metal layer to the ceramic layer via a solder material (AMB process).

Herein, an active brazing process, e.g., for bonding metal layers or metal foils, in particular also copper layers or copper foils, to ceramic material, is to be understood as a process which is specifically used for the production of metal-ceramic substrates. In this process, a bond between a metal foil, for example a copper foil, and a ceramic substrate, for example an aluminum nitride ceramic, is produced at a temperature between about 650-1000° C. using hard solder which, in addition to a main component such as copper, silver and/or gold, also contains an active metal. The active metal, which is for example at least one element selected from the group consisting of Hf, Ti, Zr, Nb, Ce, creates a bond between the solder and the ceramic material by chemical reaction, while the bond between the solder and the metal is a metallic hard solder bond.

Furthermore, for example, from DE 10 2013 113 734 B4, as well as from JP 4-325 470, a process is known in which hot isostatic pressing is used to perform bonding of a metal layer to a ceramic layer to form a metal-ceramic substrate. Hot isostatic pressing is also used for post-treatment to reduce a number of voids formed during bonding when using a soldering method or with a direct metal bonding method.

SUMMARY

Based on prior art, it is the object of the present invention to provide a carrier substrate, in particular a metal-ceramic substrate, which is further improved with respect to known carrier substrates, in particular with respect to a bonding behavior of the metal to an insulating element, for example to a ceramic element.

This object will be achieved by present invention by providing a carrier substrate according to the specification and claims, and a method for producing a carrier substrate according to the specification and claims. Further embodiments will arise from the dependent claims and the description.

According to a first aspect of the present invention, a carrier substrate, in particular a metal-ceramic substrate, is provided as a support for electrical components, comprising:
at least one metal layer and
an insulating element, in particular a ceramic element, a glass element, a glass-ceramic element and/or a high-temperature-resistant plastic element, wherein the at least one metal layer and the insulating element extend along a main extension plane and are arranged on top of each other along a stacking direction perpendicularly extending to the main extension plane, wherein a bonding layer is formed in the produced carrier substrate between the at least one metal layer and the insulating element, wherein an adhesive layer of the binding layer has a surface resistance that is greater than 5 ohm/sq, preferably greater than 10 ohm/sq, and more preferably greater than 20 ohm/sq.

BRIEF DESCRIPTION OF THE DRAWINGS

Further advantages and features will be apparent from the following description of preferred embodiments of the object according to the invention while making reference to the accompanying figures. Individual features of the individual embodiment may be combined with each other within the scope of the invention, wherein.

DETAILED DESCRIPTION

Figure 1:
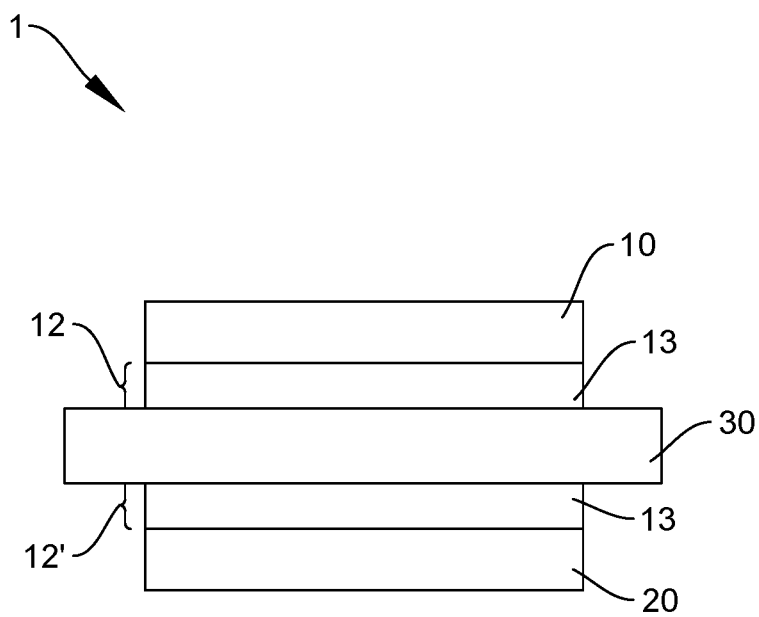
FIG. 1 shows a carrier substrate according to a first example embodiment of the present invention.

Compared to the carrier substrates known from prior art, according to the invention the surface resistance of an adhesive layer of the bonding layer is greater than 5 ohm/sq, preferably greater than 10 ohm/sq and particularly preferably greater than 20 ohm/sq. The surface resistance determined is directly related to a proportion of the active metal in the bonding layer, which is essential in bonding the at least one metal layer to the insulating element. The surface resistance increases as the proportion of active metal in the binding layer decreases. Correspondingly, high surface resistance thus corresponds to a low active metal content in the binding layer.

Surface resistance does not depend on a single parameter, but can be influenced by interaction of several parameters. For example, a purity of the active metal, a thickness of the bonding layer and/or a surface roughness of the insulating element also contribute to the definition of surface resistance. In particular, high surface resistances can only be realized by an interaction of at least two parameters.

It has been found that formation of brittle intermetallic phases is favored as the proportion of active metal increases, which in turn is detrimental to the peel strength of the metal layer on the insulation layer. In other words: the surface resistances according to the invention are used to describe binding layers the peel strength of which is improved, i.e., increased, due to reduced formation of brittle intermetallic phases. Particularly strong bonds between the at least one metal layer and the ceramic element can thus be achieved by selective adjustment of the surface resistances in accordance with the requirements. Such an increased bond strength is advantageous in terms of service life of the carrier substrate.

To determine the surface resistance, the metal layer and, if necessary, a solder base layer are first removed from the produced carrier substrate, for example by etching. A surface resistance is then measured using of a four-point measurement on the upper or lower side of the carrier substrate from which the at least one metal layer and the solder base layer have been removed. In particular, the surface resistance of a material sample is to be understood as its resistance in relation to a square surface area. It is conventional to denote the surface resistance with the unit Ohm/sq (square). The physical unit of the surface resistance is Ohm.

Preferably, a thickness of the binding layer, measured in the stacking direction, averaged over a plurality of measuring points within a predetermined area or in a plurality of areas extending or running parallel to the main extension plane, has a value which is smaller than 0.20 mm, preferably smaller than 10 μm and particularly preferably smaller than 6 μm. When reference is made to a plurality of areas, it is particularly meant that the at least one metal layer is subdivided into areas of maximum equal size and at least one value, preferably a plurality of measured values, for the thickness are recorded in each of these areas subdividing the at least one metal layer. The thicknesses determined in this way at different points are arithmetically averaged.

Compared with the carrier substrates known from prior art, a comparatively thin binding layer is formed between the at least one metal layer and the insulating element. In this context, to determine the decisive thickness of the binding layer, the measured thicknesses are averaged over a plurality of measurement points which are within a predetermined or specified area or the plurality of areas. This advantageously takes into account the fact that the insulating element, in particular the ceramic element, is generally subject to undulation, i.e., a waviness is to be attributed to the insulating element. In particular, the person skilled in the art understands that by waviness a modulation of the general flat course of the insulating element is meant, as seen over several millimeters or centimeters along a direction that extends parallel to the main extension plane. Thus, such undulation is different from a surface roughness of the insulating element, which is usually additionally present on the insulating element. By incorporating such generally unavoidable undulation of the insulating element in thickness determination, it will be assured that the binding layer may vary due to undulation, in particular that the binding layer may be larger in valley regions of the insulating element than in peak regions of the insulating element.

Regardless of this undulation, the averaged thickness value is nevertheless significantly lower than that known in prior art carrier substrates. This will particularly or for example be achieved by arranging a required active metal layer between the insulating element and the at least one metal layer, which is in particular individually, i.e., separately, arranged between the insulating element and the at least one metal layer, for example in addition to a solder base material (which for example contains no active metal or is free of active metal). Preferably, the active metal is applied to the solder base material and/or the at least one metal layer and/or the insulating element using chemical and/or physical vapor deposition, for example by a sputtering process, to realize comparatively thin active metal layers, which in turn result in a comparatively thin binding layer, in particular a homogeneous and thin adhesive layer. It is also conceivable to provide the active metal layer on the solder base material, the insulating element and/or the at least one metal layer using a plasma, in a vacuum and/or using vapor deposition. It is also conceivable to realize the active metal layer using electroplating. It is particularly preferred that the active metal layer and/or the solder base material is provided as a foil.

Preferably, a proportion of active metal in the adhesive layer comprising an active metal is greater than 15% by weight, preferably greater than 20% by weight and particularly preferably greater than 25% by weight.

Furthermore, it is conceivable that the solder base material and/or the active metal layer has recesses. In such a case, it is possible to use a thicker layer for the solder base material and/or the active metal layer, since during the bonding process the solder base material and/or the active metal layer will liquefy and fill the preceding recesses or area of recesses. Thus, a desirable, comparatively small amount of active metal can be provided for forming the bonding layer in the same manner, even if, for example, a greater thickness is associated with the active metal layer. For example, the solder base material and/or the active metal layer having a recess is a mesh or expanded metal formed, for example, from a mesh-like or fence-like network and arranged between the insulating element and the at least one metal layer. In this case, solder base material and/or active metal layer are preferably provided as foils.

Formation of comparatively thin binding layers reduces in particular an effort to be made, for example, in a "second etching" process, at least in certain areas, to remove the bonding layer to structure the carrier substrate, in particular the at least one metal layer and the bonding layer thereof. Preferably, this structuring, which is performed to electrically isolate a plurality of metal portions of the at least one metal layer from each other, is performed by an etching and/or a mechanical processing step and/or using laser light. In addition, it has been shown to be advantageous that use of low layer thicknesses can advantageously reduce the number of possible defects in the bonding layer, for example caused by material defects in the solder material. A defect in the bonding layer or a material defect in the solder material is understood to mean, for example, a large grain in the solder material, such as an active metal grain, which may lead to the formation of a giant grain in the bonding layer, and/or which does not completely melt, thus preventing minimum solder gaps as a spacer. Application, in particular using sputtering, is a simple and easy way of preventing comparatively large grains from becoming part of the active metal layer, which might still be visible in the bonding layer or the adhesive layer. Finally, it is advantageous that a thin binding layer is homogeneously formed on top of the produced carrier substrate.

In particular, by the averaged thickness of the bonding layer is meant that thicknesses are determined or measured in a stochastically or statistically distributed manner in a defined area or in several areas and that the arithmetic mean thereof will then be determined. For this purpose, for example, several microscopic images of different sectional views are first taken, preferably using a scanning electron microscope (SEM), the sectional views each extending through the substrate in a direction perpendicular to the main extension plane. In this case, the sectional images extend along a sectional plane that is perpendicular to the main extension plane. The thicknesses are then determined in the section plane. In other words, a plurality of sectional views are taken, each perpendicular to the main extension plane and distributed uniformly or irregularly at measurement points within the surface or in a plurality of different surfaces. For example, a plurality of sectional views offset parallel to each other are used, e.g., by removing slices from the carrier substrate. Then, preferably more than 25 or 100 thicknesses, preferably more than 200 and particularly preferably more than 500 thicknesses of the binding layer are measured in the specified area on the substrate, i.e., in the various sectional views, and the arithmetic mean is determined. The distance between two measurement points is at least 100 µm to reduce the influence of undulation on the measurement result. Since in a substrate there are usually two binding layers facing each other on both sides of the ceramic, the above-mentioned measured values of the layer thickness on the opposite side must also be measured in the same number. The larger the area is selected, the lower the probability that an erroneous or distorted image of the determined thicknesses in the binding layer will be recorded by the undulation. The predetermined or defined area, which extends in particular parallel to the main extension plane, has a size of more than 25 cm$^2$, preferably more than 50 cm$^2$, particularly preferably more than 100 cm$^2$, for a master card. For a carrier substrate singulated from the master card, the size may be more than 1 cm$^2$, preferably more than 1.5 cm$^2$, and particularly preferably more than 5 cm$^2$.

Particularly preferably, the following method is provided for determining and selecting the measuring areas contributing to the determination—irrespective of the size of the carrier substrate:

In a first step, the at least one metal layer of the carrier substrate is divided into nine rectangles of equal size, in particular squares, i.e., into several areas of approximately equal size. Two or three sectional images are generated in each of the measurement areas thus defined, which are used to determine an averaged thickness for the at least one metal layer in each of the sectional views. The sectional views are preferably recorded using an SEM process, for example at a magnification of 2000 or 2500 times. Subsequently, in a second step, an average is taken over the total of 18 or 27 thicknesses recorded in the sectional views, which are distributed over all nine rectangular measurement areas. In this way, it is advantageously ensured that the averaged thickness is a representative value for the bonding layer between the at least one metal layer and the insulating element for the entire carrier substrate. In other words, the process described in the paragraph provides an averaged thickness determined over the at least one metal layer, as viewed in uniformly distributed measurement areas. The method described herein for selecting the measurement area that contributes to the determination of an averaged value for the thickness is analogously to be used for surface resistance determination.

Preferably, the carrier substrate is provided as a printed circuit board in which, in the produced state, the at least one metal layer which is bonded to the insulating element is structured. For example, it is provided for this purpose that, after the bonding step, structuring is also carried out, for example using lasering, etching and/or mechanical processing, used to realize the conductor tracks and/or connections for electrical or electronic components. It is preferred that at a produced metal-ceramic substrate on the ceramic element, on the side opposite the metal layer, another metal layer, in particular a backside metallization and/or a cooling element, is provided. The backside metallization preferably is to counteract deflection and the cooling element is to effectively dissipate heat emanating during operation from electrical or electronic components connected to the printed circuit board or the metal-ceramic substrate.

Conceivable materials for the at least one metal layer and/or the at least one other metal layer in the metal-ceramic substrate or insulating element are copper, aluminum, molybdenum, tungsten, nickel and/or alloys thereof, such as CuZr, AlSi or AlMgSi, as well as laminates such as CuW, CuMo, CuAl and/or AlCu or MMC (metal matrix composite), such as CuW, CuM or AlSiC. Furthermore, it is preferred that the at least one metal layer on the completed metal-ceramic substrate is surface-modified, in particular as a component metallization. A conceivable surface modification is, for example, sealing using a noble metal, in particular silver; and/or gold, or (electroless) nickel or ENIG ("electroless nickel immersion gold") or edge casting on the metallization to suppress crack formation or crack expansion.

Preferably, the ceramic element comprises $Al_2O_3$, $Si_3N_4$, AlN, an HPSX ceramic (i.e., a ceramic with an $Al_2O_3$ matrix comprising an x-percent proportion of $ZrO_2$, for example $Al_2O_3$ containing 9% $ZrO_2$=HPS9 or $Al_2O_3$ containing 25% $ZrO_2$=HPS25), SiC, BeO, MgO, high-density MgO (>90% of the theoretical density), TSZ (tetragonally stabilized zirconium oxide) as material for the ceramic. In this context, it is also conceivable that the ceramic element is designed as a composite or hybrid ceramic in which, in order to combine various desired properties, several ceramic layers, each of which differs in terms of its material composition, are arranged one on top of each other and joined together to form an insulating element.

Preferably, the bonding layer is formed to be planar, in particular without interruption, i.e., continuously, between the at least one metal layer and the ceramic element. It is preferred that a ratio of an area in which no binding layer is formed between the at least one metal layer and the insulating element to the areas in which a binding layer is formed between the at least one binding layer and the insulating element is smaller than 0.05 mm, preferably smaller than 0.02 mm and particularly preferably smaller than 0.007 mm. In this context, the person skilled in the art particularly understands that to realize said ratio, the areas which are free of metal of the at least one metal layer due to the patterning will not be incorporated.

Preferably, it is provided that the carrier substrate comprises at least one additional metal layer which is bonded to the insulating element on a side opposite to the at least one metal layer, wherein an additional binding layer is formed in the produced carrier substrate between the at least one additional metal layer and the insulating element, wherein a cumulative thickness of the bonding layer and the additional bonding layer, measured in the stacking direction and averaged over a plurality of measuring points within a predetermined area or a plurality of areas extending parallel to the main extension plane, has a value which is smaller than 0.045 mm, preferably smaller than 0.0225 mm and particularly preferably smaller than 0.0135 mm.

It is preferred that the bonding layer and/or the additional bonding layer comprises silver of a solder material and/or a solder base material. Generally, this layer forms a solder base layer in which the main component of the solder base material accumulates in the produced carrier substrate. For example, the bonding layer is understood to be the layer formed between the at least one metal layer and the insulating element in case of a silver-based solder material. This essentially comprises silver and may be identified accordingly in a sectional view along the stacking direction of the metal-ceramic substrate. In this case, the thickness to be used or measured refers to the solid portions of silver-rich phases, in particular excluding those inclusions which are found in the at least one metal layer, in particular in the edge region to the silver layer.

Preferably, in addition to the silver resulting from a silver-based solder material or a silver-based solder base material, an adhesive layer is formed in the binding layer. In the case of a metal-ceramic substrate, the adhesive layer is preferably realized or formed by a compound comprising, on the one hand, the active metal, for example titanium, and, on the other hand, the constituent of the ceramic element, for example oxygen O, nitrogen N and/or carbon C and/or silicon Si and/or aluminum Al and/or magnesium Mg and/or calcium Ca. In a corresponding manner, the adhesive layer comprises, for example, titanium nitride, titanium carbide and/or titanium oxide, in particular in different oxidation states.

It is furthermore conceivable that the solder base material is provided as a foil, as a paste, as a layer formed by physical and/or chemical vapor deposition, and/or as an electroplated layer.

It is preferred that the bonding layer and/or the additional bonding layer is an adhesive layer comprising an active metal. In particular, the bonding layer is solely to be formed from the adhesive layer comprising the active metal. In this regard, the adhesive layer in the bonding layer comprises a bond including a constituent of the ceramic element, such as nitrogen, oxygen, or carbon, and the other constituents of the ceramic. Accordingly, the bonding layer, for example, comprises titanium nitride, titanium oxide, and/or titanium carbide. For example, the bonding layer solely comprises the adhesive layer comprising the active metal, i.e., the binding layer does not comprise silver or other base solder components. In this case, a thickness of the binding layer measured in the stacking direction averaged over a plurality of measuring points within a surface parallel to the main extension plane, or the plurality of surfaces, is to assume a value smaller than 0.003 mm (3000 nm), preferably smaller than 0.001 mm (1500 nm) and particularly preferably smaller than 0.0005 mm (500 nm) or even smaller than 0.00035 mm (350 nm). In particular, for such binding layers, in which a solder base material and/or a silver portion is eliminated, an even thinner binding layer may correspondingly be formed.

In particular, the bonding layer comprising an active metal has a substantially constant thickness, especially contrary to the solder base layer, which is modulated due to the undulation in the insulating element. In particular, the measured thickness values determined within the area or areas have a distribution to which a standard deviation is assigned that is smaller than 0.2 μm, preferably smaller than 0.1 μm and particularly preferably smaller than 0.05 μm. In particular, physical and/or chemical vapor deposition of an active metal layer and the resulting bonding layer allows a thickness of the bonding layer to be homogeneous and uniformly distributed, the bonding layer in particular solely consisting of the adhesive layer. The adhesive layer may also have a constant thickness if it is formed in addition to the solder base material.

Another object of the present invention is a method for producing a carrier substrate, in particular a metal-ceramic substrate, according to the present invention comprising:

providing at least one metal layer and an insulating element, in particular a ceramic element, a glass element, a glass-ceramic element and/or a high-temperature resistant plastic element, wherein the at least one metal layer and the insulating element extend along a main extension plane, arranging the at least one metal layer and the insulating element on top of each other in a stacking direction running perpendicularly to the main extension plane, an active metal layer being arranged between the at least one metal layer and the insulating element, and bonding the at least one metal layer to the insulating element via the active metal layer, forming a bonding layer between the at least one metal layer and the insulating element.

All advantages and properties described for the carrier substrate may be transferred or analogously transferred to the process and vice versa.

It is preferred that the active metal layer is realized by a chemical or electrochemical deposition and/or gas-physical vapor deposition (PVD) of an active metal. In this case, the active metal layer can be formed on the insulating element, the solder base material and/or the at least one metal layer. Alternatively or additionally, it is conceivable that the active metal layer is provided as a separate foil or as a foil which is provided in combination with the solder base material layer and/or a solder foil and/or with the at least one metal layer.

In particular, the use of a separately provided active metal layer allows to make this layer comparatively thin, whereby the comparatively thin thicknesses of the bonding layer as claimed can be realized, in particular averaged over different measuring values within the specified area or areas. Examples of an active metal are titanium (Ti), zirconium (Zr), hafnium (Hf), chromium (Cr), niobium (Nb), cerium (Ce), tantalum (Ta), magnesium (Mg), lanthanum (La) and vanadium (V). It should be noted herein that the metals La, Ce, Ca and Mg may easily be oxidized. It is further to be noted that the elements Cr, Mo and W are not classical active metals, but are suitable as contact layers between $Si_3N_4$ and the at least one metal layer or the solder system or solder material, since they do not form intermetallic phases with the at least one metal layer, for example copper, and have no edge solubility.

In particular, the solder base material is a metal-based base material, preferably a silver-based base material or a copper-based base material. In a silver-based base material, silver is the main component, i.e., the component with the highest percentage in terms of weight, while in a copper-based base material, copper is the main component. Examples of a silver-based base material are AgCu, in particular AgCu28, AgCuIn, AgCuSn and AgCuGa. Examples of a copper-based base material are copper CuSn, CuAg, CuIn, CuGa, CuInSn, CuInMn, and CuGaSn. It is also conceivable to use a solder base material based on NiCrMn or SnCu.

Preferably it is provided that, in the arranged active metal layer, a proportion of non-metallic impurities is to be less than 0.1 wt. %, preferably less than 0.05 wt. % and particularly preferably less than 0.01 wt. %. By minimizing impurities, it is advantageously possible to decrease the layer thickness, since in the case of any impurity being present, only part of the active metal present can contribute to bonding the at least one metal layer to the insulating element, while the remainder of the active metal is bound through the impurities. By appropriately ensuring comparatively low proportion of impurities, more effective bonding will be realized, which allows the proportion of active metal to be reduced, which in turn allows the bonding layer to be fabricated as an even thinner layer.

Furthermore, it is preferred that physical and/or chemical vapor deposition or electrochemical deposition is carried out such that a density of the active metal deposited on the insulating element greater than 90% of a theoretical density of the active metal, preferably greater than 95% of the theoretical density and particularly preferably greater than 99% of the theoretical density is realized. By the theoretical density of the active metal, the person skilled in the art in particular understands the density found in a data sheet for the active metal without artificial voids or pores being introduced into the active metal. In particular, the comparatively high densities prevent oxygen, nitrogen and/or carbon from being present in the active metal layer during bonding, which, as an impurity, in turn could lead to undesirable bonding of the active metal. In a corresponding manner, the increased density in the active metal layer increases the proportion that can effectively be used for bonding between the at least one metal layer and the ceramic element, which in turn leads to the fact that the active metal layer as such can be fabricated as a thinner layer.

Preferably, an active metal layer is to be used the thickness of which is between 10 nm and 1000 nm, preferably between 50 nm and 750 nm, particularly preferably between 100 and 500 nm. Furthermore, it is preferred that the active metal is applied using physical and/or chemical vapor deposition on the insulating element and/or the solder base material, which is preferably also formed as a film. For example, it is also conceivable that the active metal is rolled down to the desired thickness together with the solder material to form a comparatively thin bonding layer between the at least one metal layer and the insulating element.

Preferably, a solder foil is used which is smaller than 20 μm, preferably smaller than 12 μm and particularly preferably smaller than 8 μm. For example, the thickness of the solder layer has a value between 2 and 20 μm or between 2 and 5 μm, preferably between 8 and 15 μm and particularly preferably between 5 and 10 μm. Furthermore, it is conceivable that the solder base material is provided as a foil, as a paste, as a layer formed by physical and/or chemical deposition, and/or as an electroplated layer.

Furthermore, it is preferred that a roughness $R_a$ of a surface of the insulating element is smaller than 1.0 μm, preferably smaller than 0.7 μm and particularly preferably smaller than 0.5 μm, at least in some areas. By reducing the roughness on the surface of the insulating element, it is advantageously possible to avoid air inclusions or hollow areas in which oxygen can accumulate, which in turn, in regard of contamination, would be detrimental to the effective use of the active metal for bonding the at least one metal layer to the insulating element. In particular, a center roughness is assumed. The center roughness value, represented by the symbol $R_a$, indicates an average distance of a measurement point—on the surface—to a center line. The center line intersects the real profile within a reference line such that overall profile deviations in a plane parallel to the center line is distributed over a length of the reference line.

It is also conceivable that the roughness $R_a$ of a surface of the insulating element is greater than 1.0 μm at least in certain areas, preferably between 0.4 μm and 1.5 μm and particularly preferably between 0.75 and 1.25 μm. In particular, it has been found that as the roughness increases, the surface resistance also increases.

Furthermore, it has been found that it is possible to design the outermost edge of the at least one metal layer, in particular on the side facing the insulating element, such that it is less susceptible to fringe formation. While in prior art processes a fringed outermost edge is usually formed, it is possible to suppress this fringe formation. The side length of the at least one metal layer in the edge region is preferably determined to be the extension between an upper edge of the at least one metal layer on the side facing away from the insulating element, and a lower edge which limits the metal layer on the side facing the insulating element at the outermost periphery. A material-adhesion means, such as a solder material or residues thereof, is attributed to the lower edge of the at least one metal layer. In the context of structuring the at least one metal layer, it has been common in prior art practice, that the lower edge does not extend in a straight line along a circumferential direction around a metal portion formed by the structuring, causing a fringe-like pathway. This causes the length of the at least one metal layer between the upper edge and the lower edge, measured in a direction parallel to the main extension plane, to vary along the circumferential direction. This corresponds to fringe formation at the outermost periphery of the at least one metal layer. Herein, the lengths of the outermost edge dimensioned between the upper edge and the lower edge of the at least one metal layer are stochastically distributed.

It has been found that it is possible to limit this variation in the length of the outermost edge of the at least one metal layer. In particular, a standard deviation of a length of the outermost edge portion of the at least one metal layer, as measured between an top and bottom edge of the at least one metal layer in a direction parallel to the main extension plane, has a value smaller than 0.4, preferably smaller than 0.2, and more preferably smaller than 0.1. Owing to the smaller variance with regard to the length of the at least one metal layer in the edge region, it is advantageously possible to realize adjacent metal portions to be closer to each other, incorporating any manufacturing tolerances. Formation of printed circuit boards that are as compact as possible will thus be promoted.

Furthermore, it is preferred that the at least one metal layer and/or the at least one additional metal layer is bonded to the insulating element using active soldering and/or hot isostatic pressing processes and/or a DCB process.

For example, a process for manufacturing a metal-ceramic substrate is provided comprising:
- providing a solder layer, in particular in the form of at least one solder foil or hard solder foil,
- coating the insulating element and/or the at least one metal layer and/or the at least one solder layer with at least one active metal layer,
- arranging the at least one solder layer between the insulating element and the at least one metal layer along a stacking direction, forming a solder system comprising the at least one solder layer and the at least one active metal layer, wherein a solder material of the at least one solder layer is preferably free of a melting point-reducing material or of a phosphorus-free material, and bonding the at least one metal layer to the at least one ceramic layer via the solder system using an active soldering process.

In particular, a multilayer solder system comprising of at least one solder layer, preferably free of melting point-lowering elements, especially preferably of a phosphorus-free solder layer, and at least one active metal layer is provided. Separation of the at least one active metal layer and the at least one solder layer has been shown to be advantageous, in particular because comparatively thin solder layers may be realized, especially if the solder layer is a foil. Otherwise, comparatively large solder layer thicknesses are to be realized for solder materials comprising active metals because of the presence of brittle intermetallic phases or the high modulus of elasticity and high yield strength of the common active metals and their intermetallic phases, hindering re-shaping the solder paste or solder layer, as a result of which minimum layer thickness is limited by the manufacturing properties of the active metal-containing solder material. Accordingly, for active metal-containing solder layers, it is not the minimum thickness required for the joining process that determines the minimum solder layer thickness of the solder layer, but rather the minimum layer thickness of the solder layer that is technically feasible that determines the minimum solder layer thickness of the solder layer. As a result, this thicker solder layer containing active metal is more expensive than thin layers. By phosphorus-free, the person skilled in the art in particular understands that the proportion of phosphorus in the solder layer is less than 150 ppm, less than 100 ppm and particularly preferably less than 50 ppm.

Preferably, the solder layer, in particular the phosphorus-free solder layer, comprises several materials in addition to the pure metal. For example, indium is a component of the solder material used in the solder layer.

Furthermore, it is conceivable that the solder material for forming the solder layer is applied to the active metal layer and/or the at least one metal layer by using physical and/or chemical vapor deposition and/or is galvanically applied. In this way, it is advantageously possible to realize comparatively thin solder layers in the soldering system, in particular homogeneously distributed thin solder layers.

For example, further steps are provided in production of the carrier substrate, in particular the metal-ceramic substrate, comprising:
  providing a ceramic element and a metal layer,
  providing a gas-tight container enclosing the ceramic element, the container preferably being formed from the metal layer or comprising the metal layer,
  forming the metal-ceramic substrate by bonding the metal layer to the ceramic element by hot isostatic pressing,
wherein, for forming the metal-ceramic substrate, an active metal layer or a contact layer comprising an active metal is at least sectionally arranged between the metal layer and the ceramic element to promote bonding of the metal layer to the ceramic element. Preferably, the container is formed as a metal container from a metal layer and/or an additional metal layer. Alternatively, it is also conceivable that a glass container is used.

In hot isostatic pressing, it is in particular provided that bonding is performed by heating under pressure, in which the first and/or second metal layer of the metal container, in particular the later metal layer of the metal-ceramic substrate and any eutectic layer present therein, are not transformed into the melt phase. Similarly, lower temperatures are required in hot isostatic pressing than in a direct metal bonding process, in particular a DCB process.

Compared to the bonding a metal layer to a ceramic layer using a solder material, in which temperatures below the melting temperature of the at least one metal layer are usually used, the present method advantageously eliminates the need for a solder base material, requiring an active metal only. Use or utilization of pressure during hot isostatic pressing has also shown to be advantageous because air inclusions or cavities between the first metal sheet and/or the second metal sheet on the one hand and the ceramic element on the other hand can be reduced, thus reducing in frequency or even completely avoiding formation of cavities in the metal-ceramic substrate formed or produced. This has advantageous effect on the quality of the bond between the metal layer or the first and/or second metal layer of the metal container and the ceramic element. In addition, it is advantageously possible to simplify "second etching" and to avoid solder residues and silver migration.

It Is also conceivable that during hot isostatic pressing additional solder material is introduced between the ceramic element and the at least one metal layer, wherein a melting temperature of the additional solder material may be lower than the temperature at which hot isostatic pressing is performed, i.e., lower than the melting temperature of the at least one metal layer.

It is preferred that during hot isostatic pressing the metal container, in a heating and pressure device, is subjected to a gas pressure of between 100 and 2000 bar, preferably between 150 and 1200 bar and particularly preferably between 300 and 1000 bar and a process temperature of 300° C. up to a melting temperature of the at least one metal layer, in particular up to a temperature below the melting temperature. Advantageously, it has been found that it is thus possible to bond a metal layer, i.e., a first and/or second metal sheet of the metal container, to the ceramic element without using the temperatures required in a direct metal bonding process, for example a DCB process or a DAB process, and/or without using a solder base material used in active soldering. In addition, the benefit or use of appropriate gas pressure allows to potentially fabricate a maximally void-free metal-ceramic substrate, i.e., without any gas inclusions between the metal layer and the ceramic element. In particular, process parameters are used mentioned in DE 2013 113 734 A1 which are incorporated herein by reference.

Further advantages and specifications result from the following description of preferred embodiments of the invention while reference is made to the accompanying figures.

FIG. 1 shows a carrier substrate 1 according to a first example embodiment of the present invention. Such carrier substrates 1, in particular in the form of a metal-ceramic substrate, preferably are used as a support or printed circuit board for electronic or electrical components which can be bonded to the at least one metal layer 10 of the carrier substrate 1 on the component side thereof. In this context, it is preferred that the at least one metal layer 10 is structured to form appropriate conductor tracks and/or connection areas, i.e., in the completed carrier substrate 1 the at least one metal layer 10 comprises a plurality of metal portions electrically insulated from each other. The at least one metal layer 10 substantially extending along a main extension plane HSE and an insulating element 30 extending along the main extension plane HSE are thereby arranged on top of each other along a stacking direction S running perpendicularly to the main extension plane HSE and are preferably bonded or connected to each other via a bonding layer 12. Preferably, the carrier substrate 1, in addition to the at least one metal layer 10, comprises at least one additional metal layer 20 which is arranged on the side of the insulating element 30 opposite the at least one metal layer 10 and is bonded to the insulating element 30 via an additional bonding layer 12', as viewed in the stacking direction S.

In this case, the at least one additional metal layer 20 is used as a back metallization which counteracts deflection of the carrier substrate 1, in particular of the metal-ceramic element, and/or as a heat sink which is designed to dissipate any heat input caused by electrical or electronic components on the metal-ceramic substrate 1.

In particular, the carrier substrate 1 has a bonding layer 12 arranged between the at least one metal layer 10 and the insulating element 30. In this regard, it has been shown to be advantageous that a thickness of the bonding layer 12 as measured in the stacking direction S is comparatively thin. Furthermore, a comparatively thin thickness of the bonding layer 12 between the at least one metal layer 10 and the insulating element 30 has been shown to be advantageous when an etching process is provided for the purpose of structuring the at least one metal layer 10. For example, narrower insulation trenches, i.e., distances between individual metal portions of the at least one metal layer 10, may be realized in this way. For example, widths z, measured in the direction parallel to the main extension plane HSE, may thus be realized for the isolation trench between two metal portions the thickness of which is 200 μm to 400 μm, which are smaller than 700 μm, preferably less than 600 μm and particularly preferably less than 500 μm.

Furthermore, forming a thinner bonding layer 12 has been shown to be advantageous in that it may further reduce a number of possible defects in the bonding layer 12 caused by material defects in a solder material eventually used.

In the example shown in FIG. 1, the bonding layer 12 is in particular an adhesive layer 13 comprising an active metal. Preferably, the carrier substrate 1 is a metal-ceramic substrate in which the insulating element 30 is a ceramic element. In this case, the adhesive layer 13 is preferably formed from a material composition comprising a compound of ceramic element components on the one hand and an active metal on the other hand. Since they are very brittle-breaking compounds, the thinnest possible design of this adhesive layer 13 is beneficial to the adhesive strength of the at least one metal layer 10 on the insulating element 30.

Figure 2:
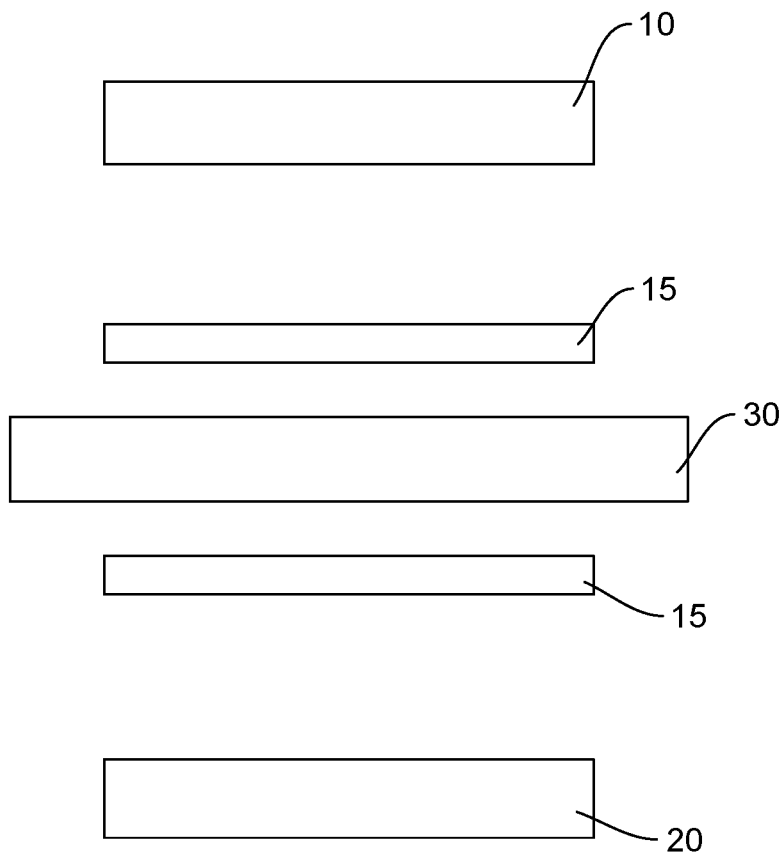
FIG. 2 shows a component of the carrier substrate of FIG. 1 prior to bonding.

In FIG. 2, the carrier substrate 1 of FIG. 1 is shown before bonding. Before the bonding process, it is provided that the insulating element 30, in particular the ceramic element, and the at least one metal layer 10 are arranged on top of each other, as viewed in stacking direction S, an active metal layer 15 being arranged between the at least one metal layer 10 and the insulating element 30.

Furthermore, it is particularly preferred that for bonding the at least one additional metal layer 20 to the side of the insulating element 30 opposite the at least one metal layer 10, an active metal layer 15 is similarly arranged between the insulating element 30 and the at least one additional metal layer 20. In this case, the at least one additional metal layer 20 and the insulating element 30 are similarly arranged on top of each other in the stacking direction S. For example, herein, bonding the at least one metal layer 10 to the insulating element 30 is carried out using hot isostatic pressing, in which a bond is realized under pressure and temperature acting on an ensemble comprising the insulating element 30, active metal layer 15 and the at least one metal layer 10. For this purpose, preferably a container is used in which the ensemble comprising the insulating element 30 and active metal layer 15 is arranged. Preferably, a portion of the gas-tight metal container forms the at least one metal layer 10 thus forming a portion of the ensemble. Alternatively, it is also conceivable that the active metal layer 15 is assisted by energy input, for example by application of light flashes, in the context of a "flash light annealing", such that bonding the at least one metal layer 10 via the active metal layer 15 to the insulating element 30 occurs. Preferably, "flash light annealing" is performed following placing the active metal layer 15 on the insulating element 30 and/or the at least one metal layer 10.

The annealing process results in that the active metal layer 15 becomes the bonding layer 12, in particular the active metal-containing adhesive layer 13. In particular, the bonding layer 12 comprises an active metal-containing material which, for example may be, inter alia, titanium carbide, titanium nitride and/or titanium oxide, preferably in different oxidation states, depending on the ceramic material.

Preferably, the active metal layer 15 is applied to the insulating element 30 and/or to the at least one metal layer 10 using physical and/or chemical vapor deposition, for example sputtering. For this purpose, it is particularly preferred that during the physical vapor deposition an active metal layer 15 is realized the density of which is greater than 90% of a theoretical density of the active metal, preferably greater than 95% of the theoretical density of the active metal and particularly preferably greater than 99% of the theoretical density of the active metal. Advantageously, a proportion of air will be reduced, in particular a proportion of oxygen in the active metal layer 15 during the bonding process, which would otherwise result in that solely a reduced proportion of the active metal, i.e., not a maximum possible proportion, will be used to bond the at least one metal layer 10 to the insulating element 30.

In particular, it has been shown to be advantageous that a proportion of impurities in the active metal layer 15 is less than 1% by weight, preferably less than 0.7% by weight and particularly preferably less than 0.5% by weight. This allows the active metal layer 15 to be applied as a layer maximally thin, resulting in formation of a comparatively thin bonding layer 12. For example, the size of the impurity depends on the purity of a carrier material. For example, the layer thickness of the active metal layer 15, as measured in stacking direction S, has a thickness of 10 nm 1000 nm preferably between 50 nm 150 nm and particularly preferably between 100 nm 500 nm prior to bonding the at least one metal layer 10 to the insulating element 30 via the active metal layer 15. Furthermore, it is particularly preferred that after the joining or bonding the at least one metal layer 10 to the insulating element 30, structuring is performed, in particular using etching or an etching process. For this purpose, patterning is performed by again removing both the sections or partial areas of the at least one metal layer 10 and the bonding layer 12 to electrically insulate the metal portions in the at least one metal layer 10 from each other.

Figure 3:
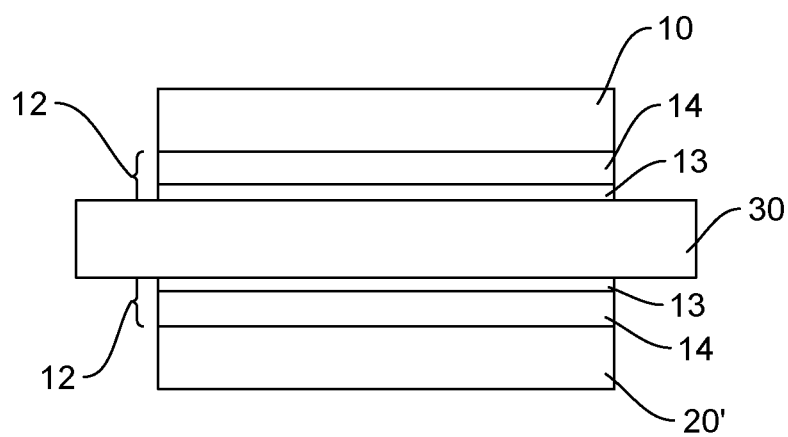
FIG. 3 shows a carrier substrate according to a second example embodiment of the present invention.

FIG. 3 shows a carrier substrate 1 according to a second example embodiment. Herein, the embodiment of FIG. 3 is different from that of FIG. 1 only in that the carrier substrate 1 has a solder base layer 14 as a bonding layer 12 in addition to an adhesive layer 13. The solder base layer 14 in particular comprises a solder main component of the solder base material 16 used as a material or the essential component of the solder base material 16. Preferably, the solder base layer 14 is formed of silver, in particular if it is a silver-based solder base material 16.

Figure 4:
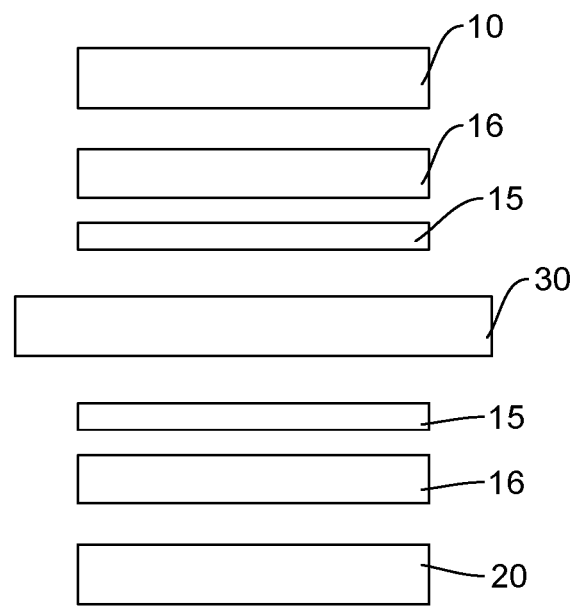
FIG. 4 shows a component of the carrier substrate of FIG. 3 prior to bonding.

FIG. 4 shows the example embodiment of FIG. 3 before joining. In contrast to the system shown in FIG. 2, a solder base material 16 is to be provided in addition to the active metal layer 15, the solder base material 16 being arranged between the insulating element 30 and the at least one metal layer 10, as seen in the stacking direction S. Preferably, the solder base material 16 is arranged between the active metal layer 15 and the at least one metal layer 10, as viewed in the stacking direction S. A soldering process is used, in which the assembled ensemble comprising the insulating element 30, the active metal layer 15, the solder material 16 and the at least one metal layer 10, is subjected to a suitable process temperature, the bonding of the at least one metal layer 10 to the insulating element 30 is effected using a solder system comprising the active metal layer 15 and the solder base material 16. The same is true when bonding the at least one additional metal layer 20 to the insulating element 30 in the example of FIG. 4. Preferably, the solder base material 16 is a foil which is arranged for bonding the at least one metal layer 10 and/or the at least one additional metal layer 20 on the one hand and the insulating element 30 on the other hand. In this context, it is conceivable that the active metal layer 15 is applied to the solder material or solder base material 16 formed as a foil by physical and/or chemical vapor deposition. In particular, it has been shown that using a separate active metal layer 15, especially together with a solder base material 16, allows realizing comparatively thin bonding layers 12.

Furthermore, it has turned out to be advantageous that using a separate active metal layer 15, as shown in the example embodiments of FIGS. 1 to 4, allows realizing a two-dimensional and continuous bonding layer 12. This is not ensured, for example, in the case of using a paste material comprising both solder base material 16 and active metal, if an equal amount of titanium is assumed or an equally thick solder system is used. These bonding defects are statistically distributed in the region of the bonding layer. Similarly, it is possible to realize an uninterrupted, i.e., continuous, bonding layer 12 by selective planar or continuous bonding of the at least one metal layer 10 to the insulating element 30, which significantly improves the bonding behavior of the at least one metal layer 10 to the insulating element 30. Preferably, a ratio between areas in which no bonding layer 12 is formed between the at least one metal layer 10 and the insulating element 30 to areas in which a bonding layer 12 is formed between the at least one metal layer 10 and the insulating element 30 has a value that is less than 0.05, preferably less than 0.025 and particularly preferably less than 0.01. It is particularly intended that only those portions of the carrier substrate 1 which are not structured, are used to determine this ratio. In other words, on the produced carrier substrate 1, the said ratio relates to a metal portion and/or a plurality of metal portions of the at least one metal layer 10 or the at least one additional metal layer 20. Preferably, the ratio is established over the entire metal-ceramic substrate or the entire carrier substrate 1, wherein the individual partial areas are summed up across the respective separate metal portions.

Figure 5:
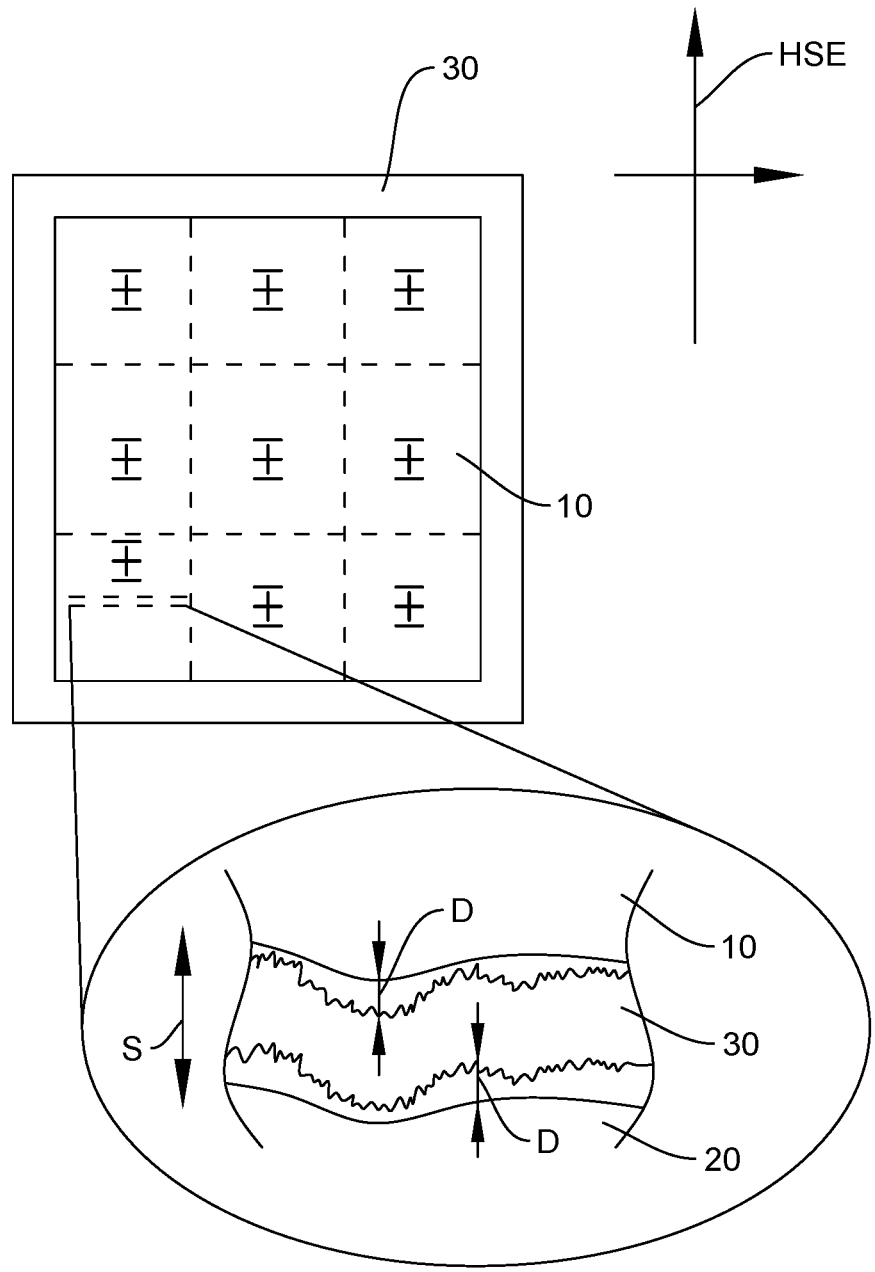
FIG. 5 is a detailed view of a carrier substrate according to a third example embodiment of the present invention.

FIG. 5 shows a carrier substrate 1 according to a third example embodiment of the present invention. In particular, the top shows a plane view of the carrier substrate 1 in a viewing direction substantially corresponding to the stacking direction S. Accordingly, the at least one metal layer 10 and the top side of the insulating element 30 protruding with respect to the outermost edge of the at least one metal layer 10 may be seen. This protruding or projecting portion, a so-called pull-back, in particular is to prevent an electrical flashover between the at least one metal layer 10 and the at least one additional metal layer 20 at a rear side of the insulating element 30. For quantitative determination of the thickness D of the bonding layer 12, it is preferred that it is determined at different positions within different areas F, preferably in several rectangles, which together form the at least one metal layer 10 or together extend across the entire surface of the carrier substrate, following determination of an average value. In the example shown, the metal layer is divided into nine rectangles or squares, i.e., areas, of approximately equal size. In each of the nine areas F, at least two, preferably three, sectional images are recorded using an SEM process. In the individual sectional images, averaged thicknesses D are determined for the bonding layer 12, in particular the adhesive layer 13 along the sectional plane. The sectional plane is perpendicular to the main extension plane HSE. The arithmetic mean of all the determined thicknesses in the sectional views is then determined. In this way, it may advantageously be incorporated that the carrier substrate 1 or the insulating element 30 generally has an undulation, i.e., a waviness, resulting in the solder base material 16 flowing into valleys of the insulating element 30 on the upper side thereof during a manufacturing process or bonding process, generating a thickness D of the bonding layer 12 along the main extension plane HSE which is modulated. Nevertheless, it has been found that the effects and consequences described as being advantageous also occur when the thickness D is comparatively thin, in particular thinner than a comparable bonding layer 12 which occurs when typical pasty solder materials 16 are used. To determine the thickness D associated with the sectional image, the thickness D can, for example, be continuously non-stop recorded along a sectional plane, i.e., integrated, or recorded in the image by a number of discrete measurements with subsequently determining the mean value.

Preferably, a cumulative thickness of the bonding layer 12 and the additional bonding layer 12', which is formed between the at least one additional metal layer 20 and the insulating element 30, is to be used. The respective thicknesses D of the bonding layer 12 and the additional bonding layer 12', which are opposite each other or are arranged so as to be congruent with each other, as viewed in the stacking direction S, are to be summed up. The cumulative thickness D is again determined at different positions in the area F or the areas F and then preferably determined over several areas or several rectangle which together form the at least one metal layer 10. In particular, by the term averaged it is meant that over the entire at least one metal layer 10, in different surface areas or rectangles a certain number, preferably a total of more than 25 measured values, particularly preferably more than 100 measured values and especially preferably more than 500 measured values, are used, wherein in each surface area or rectangle the measured values are stochastically distributed over the area F.

Figure 6A:
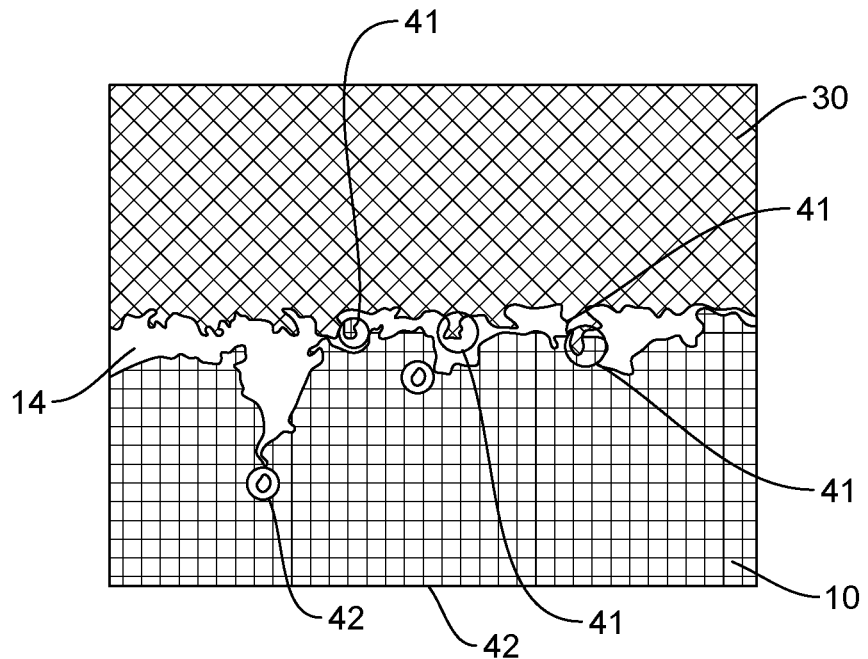
FIG. 6*a* shows an exemplary sectional views taken from a carrier substrate 1.
Figure 6B:
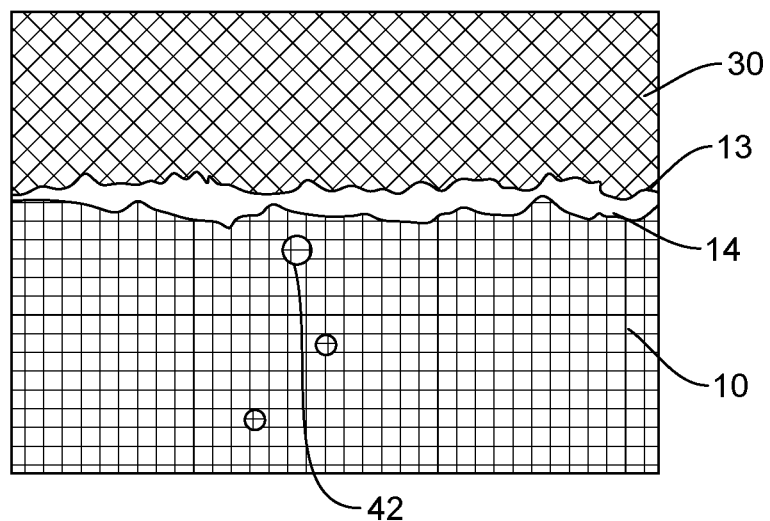
FIG. 6*b* shows an exemplary sectional views taken from a carrier substrate 1.

FIGS. 6a and 6b show two exemplary sectional views taken from a carrier substrate 1. In particular, these are copper-ceramic substrates. Whereas FIG. 6a shows a copper-ceramic substrate for the production of which a typical solder paste was used, the copper-ceramic substrate of FIG. 6b was produced using an active metal layer 15 applied by PVD process and a solder base material 16.

The conventional silver-based solder paste comprised titanium as active metal and the proportion of titanium in the solder paste can be assigned to an active metal equivalent layer thickness of 1.5 µm, while the active metal layer applied by PVD has a thickness D of 300 nm. AgCuIn with a layer thickness of 20 µm was used as a solder base material 16.

Initially, the figures show the solder base layer 14 as a light-colored stripe. Both sectional views also reveal inclusions 42 of silver in the copper layer, i.e., the at least one metal layer 10. These inclusions 42 in the copper layer are not to be incorporated in the layer thickness measurement of the bonding layer 13.

The depicted cut-outs taken from the images taken using the SEM method show that a homogeneously distributed bonding layer 13 is formed in the sectional image 6b. In addition, it may be seen that the number of brittle intermetallic phases 41 are essentially found in the bonding layer 13, which was produced using the conventional solder paste. Herein, the brittle intermetallic phases 41 are found in both the solder base layer 14 and the bonding layer 13.

The number, frequency and size of the brittle intermetallic phases 41 in turn have an influence on the peel strength, in particular in such a way that the peel strength is increased as the number of brittle intermetallic phases 41 decreases. Formation of the brittle intermetallic phases 41 is linked to the amount of active metal, in this case titanium.

Figure 7:
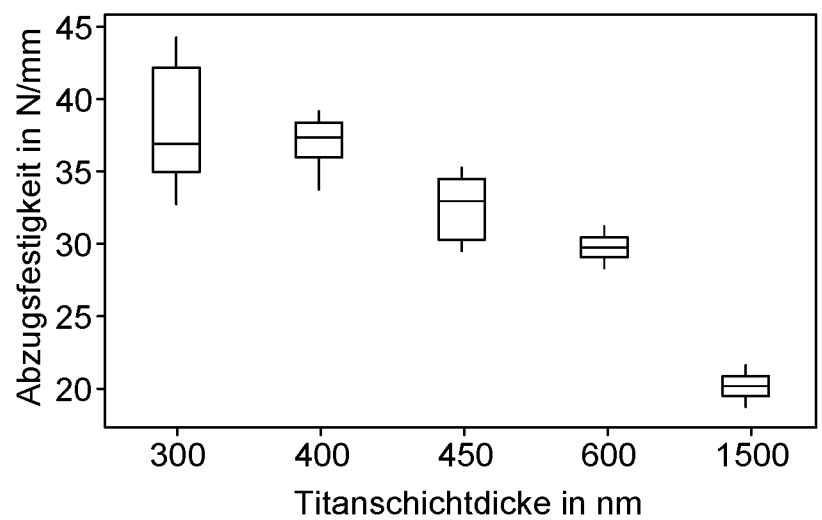
FIG. 7 shows a relationship between peel strength and thickness of the adhesion promoter layer 13.

This results in the relationship between the peel strength and the thickness of the adhesion promoter layer 13 shown in FIG. 7. It may be seen that the peel strength in N/mm increases as the thickness of the titanium layer or the equivalent thickness based on the amount of titanium used in solder pastes decreases.

The peel strengths determined herein were determined as follows:

First, a carrier substrate 1 is provided in which a copper layer having a thickness of 0.8 mm is bonded to both sides of a ceramic element by soldering. For a peel test, the copper is structured as follows: Length×width: 105 mm×5 mm. The carrier substrate is clamped in a tensile testing machine. Herein, the copper strip is peeled from the ceramic surface at a uniform speed of 10 mm/min at a 90° (+/−5°) angle. A force to be applied is continuously recorded over the length of the strip or the measurement. The mean value is formed from the range of values of the peel forces to be applied between 10% and 90% of the measuring length and then normalized to the width of the peel strip in N/mm.

In particular, it has been shown that the proportion of brittle intermetallic phases 42 depends on an active metal proportion in the bonding layer 13, in particular in the adhesive layer 13. The proportion of active metal, in particular titanium, may in turn be determined from a surface resistance which increases as the proportion of active metal decreases.

Figure 8A:
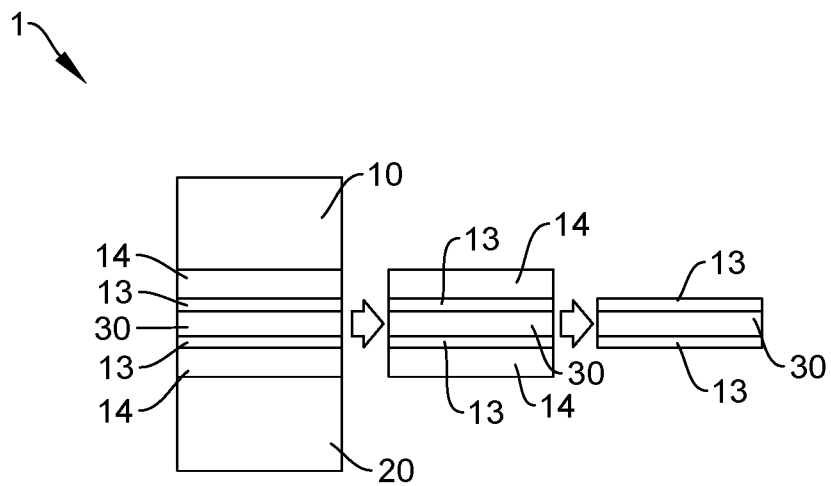
FIG. 8*a* illustrates a method for determining the surface resistance.
Figure 8B:
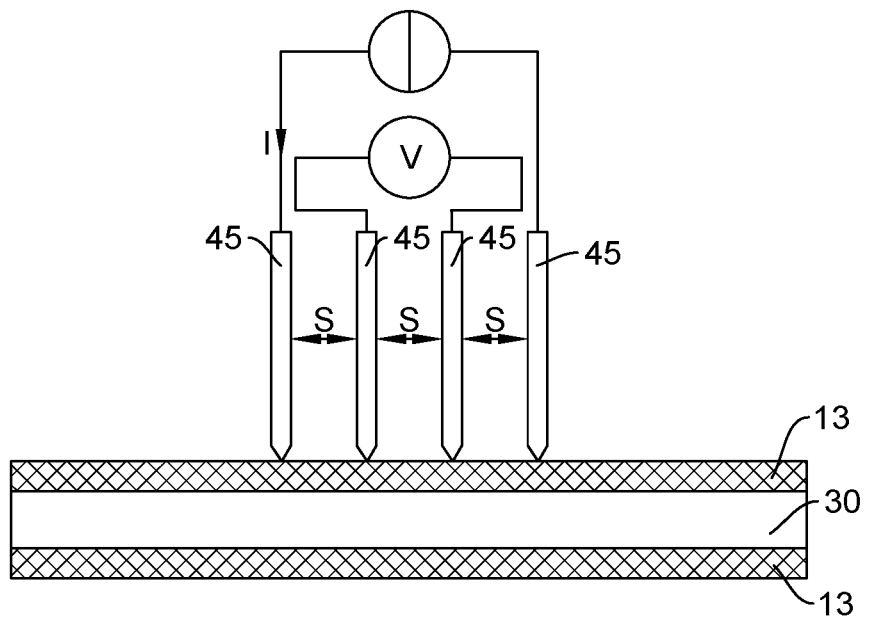
FIG. 8*b* illustrates a method for determining the surface resistance.

FIGS. 8a and 8b illustrate a method for determining the surface resistance. Herein, the at least one metal layer 10 is first etched from the carrier substrate 1, followed by the solder base layer 14, so that essentially only the adhesive layer 13 remains (see FIG. 8a). The surface resistance is then determined using a four-point method.

For this purpose, an arrangement of four measuring tips 45 is used, which are arranged next to each other in a row with equal spacing s of 5 mm. This arrangement is illustrated in $$R_\blacksquare = \frac{\rho}{d} = \frac{\pi}{\ln(2)} \cdot R \approx 4.5324 \cdot R \qquad (2)$$

FIG. 8b. The rounded measuring tips 45 are placed on the etched adhesive layer 13 using a contact pressure of 1.5 N or less. Care is taken to ensure that there is sufficient distance between the measuring tips 45 and the edge of the sample, i.e., more than three times the distance s between two adjacent measuring tips 45. While the two external measuring tips 45 induce a current I, a voltage V is determined with the two inner measuring tips 45. To avoid heating in the sample, a current I below 50 mA is used. Accordingly, the resistance R is determined from the ratio of the voltage V to the current I. The surface resistance $R_\blacksquare$ is then determined in ohms/sq according to the following formula According to the manner described above, adhesive layers 13 were measured, which were produced using the following solder materials.

| Sample | Solder | Form | Titanium |
|---|---|---|---|
| Reference 1 | AgCu26Ti5In2 | Paste 30 μm | In Paste 1500 μm |
| Reference 2 | AgCu26Ti5In2 | Paste 30 μm | In Paste 1500 μm |
| AMB VI | AgCu27.4In2 | Foil 8 μm | PVD 300 nm |
| AMB V2 | AgCu27.4In2 | Foil 8 μm | PVD 300 nm |
| AMB V3 | AgCu27.4In2 | Foil 8 μm | PVD 300 nm |
| AMB V4 | AgCu27.4In2 | Foil 6 μm | PVD 300 nm |
| AMB V5 | AgCu27.4In2 | Foil 10 μm | PVD 300 nm |

Conventional solder pastes comprising titanium as an active metal are used as references (reference 1 and reference 2). The amount of titanium comprised in the paste corresponds to an active metal equivalent layer thickness of 1500 nm. In this case, the thickness of the paste is about 30 μm. Such an equivalent layer thickness is determined on the basis of the proportion of titanium in the paste, since the titanium is a component of the paste and is uniformly distributed therein.

The paste was placed between a copper layer and a $Si_3N_4$ ceramic layer having a layer thickness of about 30 μm, followed by the bonding process.

The solder systems from samples AMB V1 to AMB V5 were composed of a titanium active metal layer with a thickness of 300 nm applied to the Si3N4 ceramic layer using PVD. The solder base material 16 corresponds to the composition of the conventional solder paste (without titanium) used in References 1 and 2 and was provided as a solder foil, respectively.

The solder system was placed between the Si3N4 ceramic layer and the copper layer, followed by bonding.

To determine the surface resistance, the copper layer and the solder base layer 14 were removed again by etching. As a result, the adhesive layer 13 remains on the top and bottom of the ceramic layer, respectively.

The constituents to be measured were determined on the top surfaces of the samples by means of a XRF measurement. The result shows the following proportions of elements on the top or bottom side of the ceramic layer including the adhesive layer in at %:

| Sample | y | Si | Ti | Ag | Cu |
|---|---|---|---|---|---|
| Reference 1 | 3.85 | 83.36 | 12.60 | 0.05 | 0.16 |
| Reference 2 | 3.84 | 85.52 | 10.48 | 0.04 | 0.14 |
| AMB V1 | 1.73 | 95.49 | 2.72 | 0.01 | 0.06 |
| AMB V2 | 3.09 | 94.18 | 2.67 | 0.02 | 0.06 |
| AMB V3 | 1.75 | 95.37 | 2.81 | 0.02 | 0.06 |
| AMB V4 | 1.67 | 95.41 | 2.85 | 0.02 | 0.06 |
| AMB V5 | 1.97 | 95.53 | 2.44 | 0.02 | 0.06 |

It may be seen from the table that the proportions of silver and copper on the top and bottom sides of the sample are negligible, so that they do not have any significant impact on the surface resistance.

Figure 9:
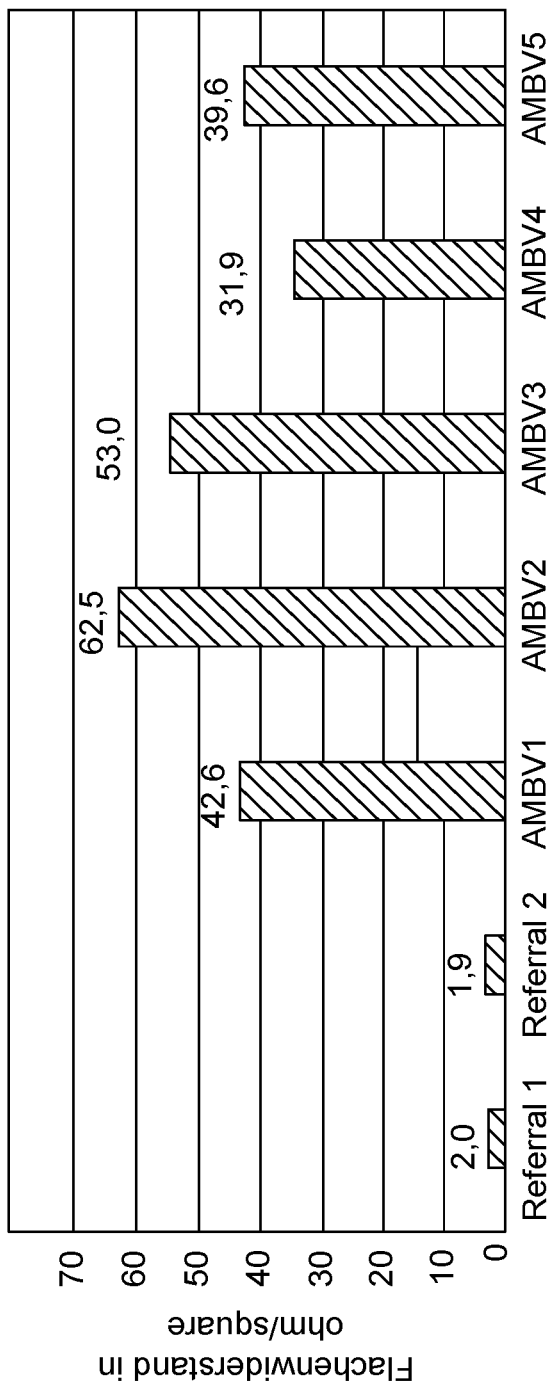
FIG. 9 summarizes results for surface resistances.

FIG. 9 summarizes the results for the surface resistances determined using the method described above. It may be seen that the surface resistances for the samples AMB V1 to AMB V5 are more than 15 times as large as the surface resistances for the references 1 and 2. For the samples AMB V1 to AMB V5, ceramics from different manufacturers and different PVD systems were also used. The surface resistances reflect the proportion of titanium in the bonding layer 12 and the adhesive layer 13, as may also be seen from the XRF measurements. This reduced proportion of titanium has significant impact on the formation of brittle intermetallic phases 42 in the bonding layer 12, and in particular, in the adhesive layer 13 as well, which intermetallic phases in turn adversely affect the peel strength. The reduced surface resistance thus reflects that reduced formation of intermetallic phases occurs when the surface resistance is greater than 5 ohm/sq, preferably greater than 10 ohm/sq, and particularly preferably greater than 20 ohm/sq.

LIST OF REFERENCE NUMBERS

1 Carrier substrate
10 Metal layer
12 Bonding layer
12' Additional bonding layer
13 Adhesive layer
14 Solder base layer
15 Active metal layer
16 Solder base material
20 Additional metal layer
30 Insulating layer
41 Brittle intermetallic phases
42 Inclusions
45 Measuring tips
s Distance
D Thickness
HSE Main extension plane
S Stacking direction

The invention claimed is:

1. A carrier substrate (1) as a carrier for electrical components, comprising:
at least one metal layer (10) and
an insulating element (30),
wherein the at least one metal layer (10) and the insulating element (30) extend along a main extension plane (HSE) and are arranged on top of each other along a stacking direction(S) running perpendicularly to the main extension plane (HSE),
wherein a bonding layer (12) is formed in the produced carrier substrate (1) between the at least one metal layer (10) and the insulating element (30), and
wherein an active-metal comprising adhesive layer (13) of the bonding layer (12)
has a surface resistance which is greater than 5 ohm/sq, and
the active metal comprises titanium (Ti), zirconium (Zr), hafnium (Hf), niobium (Nb), cerium (Ce), tantalum (Ta), magnesium (Mg), lanthanum (La) or vanadium (V).

2. The carrier substrate (1) according to claim 1, wherein a thickness (D) of the bonding layer (12), measured in the stacking direction(S), averaged over a plurality of measuring points within one or more predetermined areas (F) which runs or runs parallel to the main extension plane (HSE), has a value, which is smaller than 20 μm.

3. The carrier substrate (1) according to claim 1,
wherein the carrier substrate (1) comprises at least one additional metal layer (20) which is bonded to the insulating element (30) on a side opposite the at least one metal layer (10), wherein an additional bonding layer (12') is formed in the produced carrier substrate (1) between the at least one additional metal layer (20) and the insulating element (30), and
wherein a cumulative thickness of the bonding layer (12) and the additional bonding layer (12'), measured in the stacking direction(S) and averaged over a plurality of measuring points within the area (F) or areas (F) running parallel to the main extension plane (HSE), has a value which is smaller than 0.045 mm.

4. The carrier substrate (1) according to claim 1, wherein the bonding layer (12) and/or the additional bonding layer (12') comprises a silver-rich layer of a solder material and/or a solder base material (16).

5. The carrier substrate (1) according to claim 1, wherein the bonding layer (12) and/or the additional bonding layer (12') is an adhesive layer (13) comprising an active metal.

6. The carrier substrate (1) according to claim 5, wherein a proportion of active metal in the adhesive layer (13) comprising an active metal is greater than 15% by weight.

7. The carrier substrate (1) according to claim 4, wherein a thickness (D) of the bonding layer (12) and of the additional bonding layer (12), measured in the stacking direction(S) and summed up, averaged over a plurality of measuring points within the area (F) running parallel to the main extension plane (HSE), has a value which is smaller than 0.005 mm.

8. The carrier substrate (1) according to claim 1, wherein a roughness $R_a$ of a surface of the insulation element (30) in at least an area thereof is smaller than 1.0 μm.

9. The carrier substrate (1) according to claim 1, wherein a roughness $R_a$ of a surface of the insulation element (30) in at least an area thereof, is greater than 1.0 μm.

10. The carrier substrate (1) according to claim 1, wherein a standard deviation of a length of the outermost edge region of the at least one metal layer (10), measured in a direction parallel to the main extension plane (HSE) between a top and bottom edge of the at least one metal layer (10), has a value smaller than 0.4.

11. A method for producing the carrier substrate (1) of claim 1, the method comprising:
providing at least one metal layer (10) and an insulating element (30), wherein the at least one metal layer (10) and the insulating element (30) extend along a main extension plane (HSE),
arranging the at least one metal layer (10) and the insulating element (30) on top of each other in a stacking direction(S) running perpendicularly to the main extension plane (HSE), an active metal layer (15) being arranged between the at least one metal layer (10) and the insulation element (30), wherein the active metal layer comprises titanium (Ti), zirconium (Zr), hafnium (Hf), niobium (Nb), cerium (Ce), tantalum (Ta), magnesium (Mg), lanthanum (La) or vanadium (V), and
bonding the at least one metal layer (10) to the insulating element (30) via the active metal layer (15) to form a bonding layer (12) between the at least one metal layer (10) and the insulating element (30).

12. The method according to claim 11, wherein a proportion of impurities in the arranged active metal layer (15) is less than 1 wt. %.

13. The method according to claim 11, wherein a physical and/or chemical vapor deposition or evaporation or an electrochemical deposition is performed such that a density of the active metal arranged on the insulation element is greater than 90% of a theoretical density of the active metal.

14. The method according to claim 11, wherein a roughness $R_a$ of a surface of the insulation element (30), at least in some areas, is smaller than 1.0 μm.

15. The method according to claim 11, wherein a multi-layer soldering system comprising at least one solder layer and at least one active metal layer is provided.

16. The carrier substrate (1) of claims 1, wherein
the carrier substrate (1) is a metal-ceramic substrate for electrical components,
the insulating element (30) is a ceramic element, a glass element, a glass-ceramic element,
a thickness (D) of the bonding layer (12), measured in the stacking direction(S), averaged over a plurality of measuring points within one or more predetermined areas (F) which runs or runs parallel to the main extension plane (HSE), has a value smaller than 20 μm,
the carrier substrate (1) comprises at least one additional metal layer (20) which is bonded to the insulating element (30) on a side opposite the at least one metal layer (10), wherein an additional bonding layer (12') is formed in the produced carrier substrate (1) between the at least one additional metal layer (20) and the insulating element (30), and
wherein a cumulative thickness of the bonding layer (12) and the additional bonding layer (12'), measured in the stacking direction(S) and averaged over a plurality of measuring points within the area (F) or areas (F) running parallel to the main extension plane (HSE), has a value smaller than 0.045 mm.

17. The carrier substrate (1) according to claim 16 wherein the bonding layer (12) and/or the additional bonding layer (12') is an adhesive layer (13) comprising an active metal, wherein a proportion of active metal in the adhesive layer (13) comprising an active metal is greater than 15% by weight.

18. The carrier substrate (1) according to claim 1, wherein a standard deviation of a length of the outermost edge region of the at least one metal layer (10), measured in a direction parallel to the main extension plane (HSE) between a top and bottom edge of the at least one metal layer (10), has a value smaller than 0.4.

19. The method according to claim 11, wherein
a proportion of impurities in the arranged active metal layer (15) is less than 1 wt. %, and
a physical and/or chemical vapor deposition or evaporation or an electrochemical deposition is performed such that a density of the active metal arranged on the insulation element is greater than 90% of a theoretical density of the active metal.

20. The method according to claim 15, wherein the at least one solder layer is free of melting point-reducing elements.

* * * * *